United States Patent
Magee et al.

(10) Patent No.: US 9,224,444 B1
(45) Date of Patent: Dec. 29, 2015

(54) METHOD AND APPARATUS FOR VT INVARIANT SDRAM WRITE LEVELING AND FAST RANK SWITCHING

(71) Applicant: Xilinx, Inc., San Jose, CA (US)

(72) Inventors: Terence J. Magee, San Francisco, CA (US); Sathappan Ravi, Santa Clara, CA (US); Dhruv Choksey, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/523,781

(22) Filed: Oct. 24, 2014

(51) Int. Cl.
*G11C 8/00* (2006.01)
*G11C 7/22* (2006.01)
*G11C 7/10* (2006.01)
*G11C 8/18* (2006.01)

(52) U.S. Cl.
CPC .............. *G11C 7/222* (2013.01); *G11C 7/1072* (2013.01); *G11C 8/18* (2013.01)

(58) Field of Classification Search
CPC ......... G11C 7/1072; G11C 7/222; G11C 8/18
USPC ...................... 365/233.1, 233.12, 233.13, 193
See application file for complete search history.

(56) References Cited

U.S. PATENT DOCUMENTS

| | | | | |
|---|---|---|---|---|
| 7,227,395 B1 * | 6/2007 | Huang | ..................... | G11C 7/22 327/158 |
| 7,839,716 B2 | 11/2010 | Kong et al. | | |
| 8,514,001 B1 * | 8/2013 | Lee | ..................... | G11C 7/1006 327/233 |
| 2006/0017480 A1 * | 1/2006 | Lin | ..................... | H03H 11/265 327/158 |

* cited by examiner

*Primary Examiner* — Han Yang
(74) *Attorney, Agent, or Firm* — Kin-Wah Tong

(57) ABSTRACT

A method, non-transitory computer readable medium and apparatus for synchronizing a clock signal data path, a write strobe signal data path and a write data signal data path are disclosed. The method determines an amount of phase shift between the clock signal data path and the write strobe signal data path and between the clock signal data path and the write data signal data path, gates a clock signal to generate strobe clock signals that are phase shifted by at least one phase shift, applies a fine phase shift to the strobe clock signals where the strobe clock signals have an overall phase shift that is approximately equal to the amount of phase shift, and synchronizes a launch of the clock signal data path, the write strobe signal data path, and the write data signal data path using the strobe clock signals with the overall phase shift.

20 Claims, 5 Drawing Sheets

METHOD AND APPARATUS FOR VT INVARIANT SDRAM WRITE LEVELING AND FAST RANK SWITCHING

FIELD OF THE INVENTION

The present disclosure relates generally to memory designs, e.g., DDR3 and DDR4 synchronous dynamic random-access memory (SDRAM) and, more particularly, to a method and apparatus for a voltage and temperature (VT) invariant SDRAM write leveling and fast rank switching.

BACKGROUND OF THE INVENTION

In the control of SDRAM, phase relationship between clock signals (CK) and write strobe signals (DQS) indicating validity of an associated write data signal (DQ) are important to proper operation of the SDRAM device. In particular, the design of a memory controller for DDR3 and DDR4 SDRAM devices require proper alignment and timing of these various signals to be within very tight timing tolerances.

A so called "fly-by" architecture is used for DDR3/4 SDRAM memory control. In the "fly-by" architecture, the CK signal from a memory control device is serially daisy chained from SDRAM device to SDRAM device. The serial distribution of the CK signal results in an approximately 0 to 3 nanosecond (ns) skew between the CK signal and the individual DQS signals applied to the SDRAM devices. However, DDR3/4 SDRAM signal timing requires a ¼ clock phase relationship between the CK signal and the DQS signal as applied to a particular SDRAM device. Such a skew can violate this requirement.

One prior solution to these timing skew problems was to provide delay lines within the memory controller and to perform a so-called "write-leveling" procedure. The write-leveling procedure is a process to configure the use of the variable delay lines within the memory controller to adapt to the particular timing requirements of the SDRAM application. However, such physical delay lines may be subject to VT variation as the memory system operates. In addition, large physical delay lines will increase jitter and duty cycle distortion on the DQS and DQ signals.

In addition, the write-leveling procedure is performed at the startup of the system using the DDR3/4 SDRAM subsystem. However, the write-leveling procedure requires that the memory subsystem be "off-line". As a result, periodic repetition of the write-leveling procedure may degrade the performance of the system using the DDR3/4 SDRAM subsystem.

Another solution launches DQ and DQS signals off one of four clock phases that have a minimum resolution relative to the CK signal of 45 degrees of the CK period. However, there are many factors that will eat into an ideal margin of "90 less 45 degrees". Some factors include the setup and hold time of write leveling flop in SDRAM, jitter, noise, crosstalk and inter-symbol interference (ISI) effects. Another factor is that the fixed delays of approximately 45 degrees of the CK period are not calibrated against varying effects of process, voltage or temperature. In addition, timing between the four parallel clock phases can be difficult for rank switching where the phase of the DQ and DQS signals need to change between bursts based on the difference in per rank timing.

SUMMARY OF THE INVENTION

A method for synchronizing a clock signal data path, a write strobe signal data path and a write data signal data path is disclosed. One embodiment of the method includes determining, by a memory controller, an amount of phase shift between the clock signal data path and the write strobe signal data path and between the clock signal data path and the write data signal data path and gating, by the memory controller, a clock signal to generate strobe clock signals that are phase shifted by one or more of a plurality of phase shifts in accordance with the amount of phase shift. A fine phase shift is applied by the memory controller to the strobe clock signals where the strobe clock signals have an overall phase shift that is approximately equal to the amount of phase shift, where the overall phase shift comprises the one or more plurality of phase shifts applied by the gating and the fine phase shift and a launch of the clock signal data path, the write strobe signal data path, and the write data signal data path is synchronized by the memory controller using the strobe clock signals with the overall phase shift.

According to another embodiment, a non-transitory computer-readable medium storing a plurality of instructions which, when executed by a memory controller, cause the memory controller to perform operations for synchronizing a clock signal data path, a write strobe signal data path and a write data signal data path is provided. The operations of non-transitory computer readable medium include determining an amount of phase shift between the clock signal data path and the write strobe signal data path and between the clock signal data path and the write data signal data path and gating a clock signal to generate strobe clock signals that are phase shifted by one or more of a plurality of phase shifts in accordance with the amount of phase shift. A fine phase shift is applied to the strobe clock signals where the strobe clock signals have an overall phase shift that is approximately equal to the amount of phase shift, where the overall phase shift comprises the one or more plurality of phase shifts applied by the gating and the fine phase shift and a launch of the clock signal data path, the write strobe signal data path, and the write data signal data path is synchronized using the strobe clock signals with the overall phase shift.

According to another embodiment, an apparatus includes at least one clock gate for generating strobe clock signals and a plurality of phase shifts coupled to the at least one clock gate, each one of the plurality of phase shifts having a different phase shift for applying a phase shift of an overall phase shift to the strobe clock signals. At least one fine phase shift coupled to the at least one clock gate applies an additional phase shift of the overall phase shift. A clock signal data path, a write strobe signal data path, and a write signal data path coupled to the at least one fine phase shift are synchronized using the strobe clock signals with the overall phase shift.

Other features will be recognized from consideration of the detailed description and the claims.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

Figure 1:
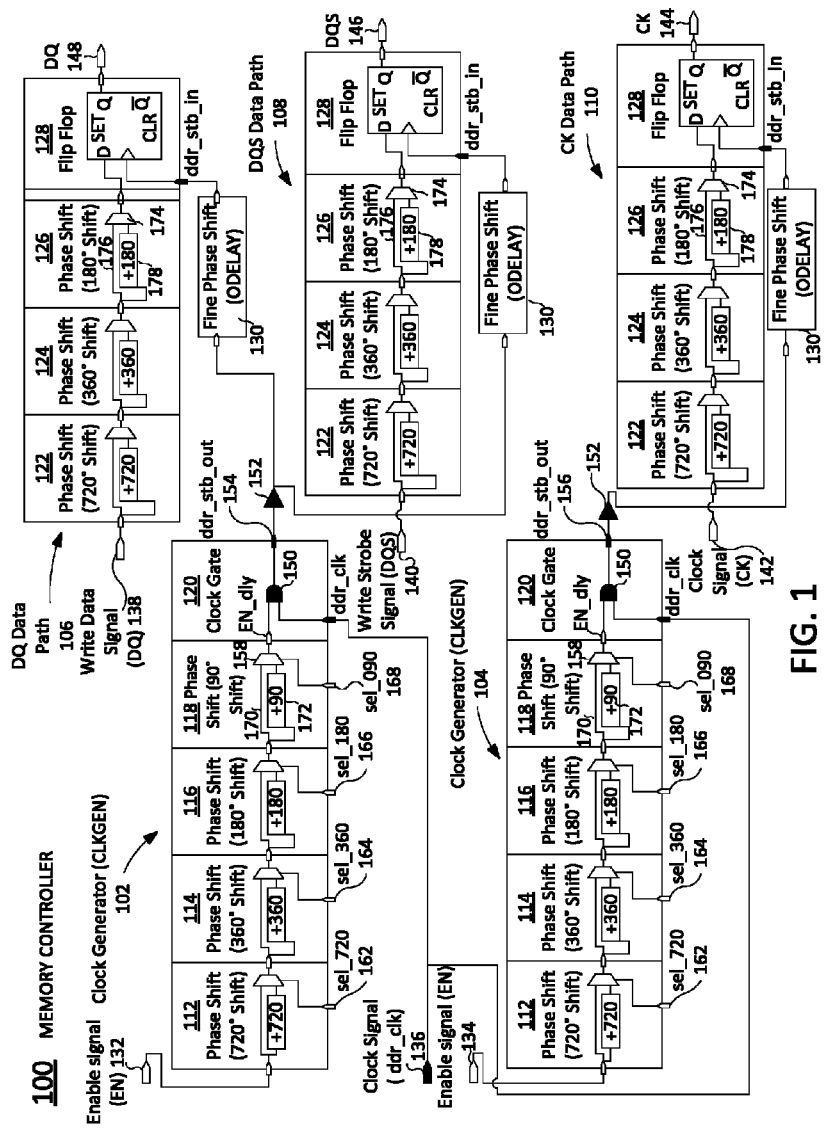
FIG. 1 illustrates an exemplary circuit to implement a method for synchronizing a clock signal data path, a write strobe signal data path, and a write data signal data path that control a memory.

The present disclosure broadly discloses a method, non-transitory computer readable medium, and apparatus for synchronizing a clock signal data path, a write strobe signal data path, and a write data signal data path that control a memory, e.g., DDR3 SDRAM, DDR4 SDRAM, and the like. As discussed above, the phase relationship between the CK, DQS, and DQ signals are important for proper operation of the SDRAM device. Current designs to synchronize the phases between CK, DQS, and DQ signals either apply a physical delay line or use multiple parallel delay lines of 45 degrees of the CK period.

However, physical delay lines in the data path increases jitter and duty cycle distortion on the CK, DQS, and DQ signals. In addition, the physical delay lines are not invariant to temperature and voltage changes.

Using multiple parallel delay lines creates a difficult problem in timing between the parallel delay lines for rank switching. In addition, many factors may eat into the ideal margin of 90 less 45 degrees relied upon by the previous designs.

One embodiment of the present disclosure provides a method for synchronizing a CK data path, the DQS data path, and the DQ data path that is voltage and temperature invariant and uses 90 degree periods of the CK period. The methods employed herein avoid the need for large delays on the DQ and DQS outputs which can degrade the signal integrity of these signals. The methods described herein rely on a single strobed clock that uses clock edges for the delays or phase shifts. The amount of phase shift may be determined or calculated by a write-leveling procedure that is performed once during a start up of a computer system containing the memory. As a result, the delays or phase shifts are voltage and temperature invariant. The use of a single strobed clock as opposed to multiple continuous phase shifted clocks avoids margin loss due to skew when muxing between many phased clocks and greatly reduces power consumption when write operations are not occurring. Furthermore, noise in the computer system is reduced when the memory controller reads from the memory.

Moreover, the circuitry to launch the CK signal to the memory is identical to the circuitry in the memory, but no phase delay is added. Therefore, the difference in phase between the CK and DQ/DQS signals completely represents the skew between the CK and DQ/DQS signals as seen in the memory. The identical paths on CK and DQ/DQS signals are as they occur in the memory controller and will move together with VT variation in the memory. As a result, no repeat of write leveling is required after startup as in prior solutions. As noted above, repeated need for write-leveling at each startup can degrade performance of the computer system.

In addition, the embodiments of the present disclosure allow for fast rank switching between multiple ranks of memory. For example, different phase shifts or delays between consecutive write bursts to different ranks in a memory system that may require different phases of DQ/DQS relative to CK may be applied with minimum degradation to the performance of the computer system.

FIG. 1 illustrates an exemplary circuit 100 (e.g., implemented in part or in whole within a memory controller) to implement methods described herein. In one embodiment, the circuit 100 may be used to synchronize the write data signal (DQ) and the write strobe signal (DQS) to a clock signal (CK) of a memory. In one embodiment, the memory may be a DDR3 or DDR4 SDRAM memory. However, it should be noted that the circuit 100 may be used in any type of memory that requires synchronization of a DQ signal and a DQS signal to a CK signal.

In one embodiment, the exemplary circuit 100 includes a clock generator 102 that feeds a DQ data path 106 and a DQS data path 108 and a clock generator 104 that feeds a CK data path 110. In one embodiment, the clock generators 102 and 104 may use a common clock signal 136 of the memory also labeled "ddr_clk". The clock signal 136 may be a continuous clock signal having a period that is a function of the memory data rate. For example, for a 2.667 Gigbits per second (Gbps) data rate memory, the clock signal 136 may be 2.667 GHz with a period of 375 picoseconds (ps). In one embodiment, the clock generator 104 may be optional if no phase shift is applied to the CK data path. In other words, in some embodiments only a single clock generator 102 may be needed.

In one embodiment, the clock signal 136 may be fed into a clock gate 120 (broadly a logic gate) as an input labeled "ddr_clk". The clock gate 120 may gate the clock signal 136 on and off to generate bursts of strobe clock signals 154 and 156 labeled "ddr_stb_out". In one embodiment, a duration or a length of time of the bursts for the strobe clock signals 154 and 156 may be a function of how much data is to be sent. The strobe clock signals 154 and 156 may then be delayed or shifted by one or more of a plurality of phase shifts 112, 114, 116 and 118 (broadly phase shift logics or circuits). It should be noted that the terms "phase shift" and "delay" are used interchangeably in this disclosure.

In one embodiment, the clock gate 120 may comprise an AND gate 150 and a buffer 152. The AND gate 150 may be used to perform the gating on and off of the continuous clock signal 136. It should be noted that although FIG. 1 illustrates the use of an AND gate, any logic gate may be used to perform the gating. For example, a NAND gate could be used with appropriate modification to other portions of the circuit 100.

In one embodiment, the phase shift 118 may be a 90 degree phase shift, the phase shift 116 may be a 180 degree phase shift, the phase shift 114 may be a 360 phase shift, and the phase shift 112 may be a 720 phase shift. It should be noted that the periods of each phase shift are provided only as examples and the periods may be any value based upon a need for a particular application.

In one embodiment, 360 degrees may be equivalent to a single period of the CK signal or two periods of the clock signal 136 of the memory. Thus, the phase shifts 112, 114, 116, and 118 may be associated with an amount of time for each respective phase shift. Using the above example of a 2.667 Gbps data rate with a 1333 megahertz (MHz) clock (CK) having a period of 750 ps, the phase shift 114 of 360 degrees would add a delay of 750 ps, the phase shift 118 of 90 degrees would be a quarter of the clock period and add a delay of 187.5 ps, and so forth.

In one embodiment, any combination of one or more of the phase shifts 112, 114, 116, and 118 may be selected and added to the strobe clock signals 154 and 156. For example, for a phase shift of 270 degrees, the phase shift 118 of 90 degrees and the phase shift 116 of 180 degrees could both be selected. In one embodiment, the phase shifts may be added when an enable signal 132 is introduced and the corresponding phase shift selection signal or signals 162, 164, 166, and 168 are received or activated.

In one embodiment, phase shifts 112, 114, 116, and 118 may each comprise a multiplexer 158, a pass through line 170, and a phase shift line 172 (shown only for phase shift 118 for clarity). The multiplexer 158 may allow the enable signal 132 to pass through unaltered via the pass through line 170 or add a phase shift via the phase shift line 172 when the phase shift selection signal 168 is activated. The phase shifts 112, 114, and 116 may be deployed using similar circuitry.

The description of the clock generator 102 described above may be equally applied to the clock generator 104. In other words, the clock generator 102 and the clock generator 104 may be deployed in a similar fashion or using the same circuitry. In one embodiment, the clock generator 104 may receive a separate enable signal 134. In one embodiment, the phase shift selection signals 162, 164, 166 and 168 may be different than the phase shift selection signals 162, 164, 166 and 168 of the clock generator 102. That is, the clock generator 104 may apply a different phase shift to the CK data path 110 than the phase shift applied to the DQ data path 106 and the DQS data path 108 by the clock generator 102.

In one embodiment, the clock generator 102 may output a strobe clock signal 154 to the DQ data path 106 and the DQS data path 108 and the clock generator 104 may output a strobe clock signal 156 to the CK data path 110. In one embodiment, the strobe clock signals 154 and 156 may each be passed through a fine phase shift 130, also referred to as "ODELAY". In one embodiment, the fine phase shift (broadly a phase shift) 130 may add an additional phase shift between 0 degrees and 90 degrees. Any known method or circuitry for introducing the fine phase shift 130 may be used.

In one embodiment, the strobe clock signals 154 and 156 having an overall phase shift or delay may be fed as an input labeled "ddr_stb_in" to a flip flop 128 of the DQ data path 106 for providing the DQ signal 148, the DQS data path 108 for providing the DQS signal 146, and the CK data path 110 for providing the CK signal 144. The overall phase shift may be a combination of the phase shift added by the clock generators 102 and 104 and the fine phase shift 130.

In one embodiment, a phase shift may be applied to each one of the DQ data path 106, the DQS data path 108, and the CK data path 110 such that the phase of the respective data paths 106, 108 and 110 is aligned with the phase of the strobe clock signals 154 and 156. In one embodiment, each one of the DQ data path 106, the DQS data path 108, and the CK data path 110 may each have a plurality of phase shifts 122, 124, and 126 (broadly phase shift logics or circuits). In one embodiment, the phase shift 122 may be a 720 degree phase shift, the phase shift 124 may be a 360 degree phase shift, and the phase shift 126 may be a 180 degree phase shift. It should be noted that any amount of phase shifts in increments of 90 degrees may be used for the phase shifts 122, 124, and 126 based upon a particular application.

In one embodiment, the phase shifts 122, 124, and 126 may each comprise a multiplexer 174, a pass through line 176 and a phase shift line 178 (shown only for phase shift 126 for clarity). When each of the DQ signal 138, the DQS signal 140, and the CK signal 142 are launched, the DQ signal 138, the DQS signal 140 and the CK signal 142 may be passed through a respective data path 106, 108 and 110 having the series of phase shifts 122, 124, and 126 and a flip flop 128 to ensure that the DQ signal 138, the DQS signal 140, and the CK signal 142 are synchronized or aligned in phase with the strobe clock signals 154 and 156.

As a result, the DQ signal 138, the DQS signal 140, and the CK signal 142 may be synchronized or aligned while minimizing the amount of physical delay lines that the DQ signal 138, DQS signal 140, and the CK signal 142 must travel through to no more than a quarter of the clock period of the memory. In other words, the maximum amount of physical delay introduced by the embodiments of the present disclosure is 90 degrees introduced by the fine phase shift 130. As noted above, the physical delay lines may add undesirable jitter and distortion.

In one embodiment, the amount of phase shift or delay that needs to be added to the strobe clock signals 154 and 156 may be obtained during a write-leveling procedure. However, unlike previous designs, the embodiments of the present disclosure only require the write-leveling procedure to be performed once or a single time.

As discussed above, previous designs required the write-leveling procedure to be performed each time the computer system was started. The write-leveling procedure required that the memory subsystem be "off-line" leading to a degradation of the performance of the computer system. In contrast, the exemplary circuit 100 used to apply the phase shift to the clock signal 136 will have a VT variation that moves together with the paths of the DQ, DQS, and CK signals in the memory. As a result, no repeat of the write-leveling procedure is required after each startup.

Figure 2:
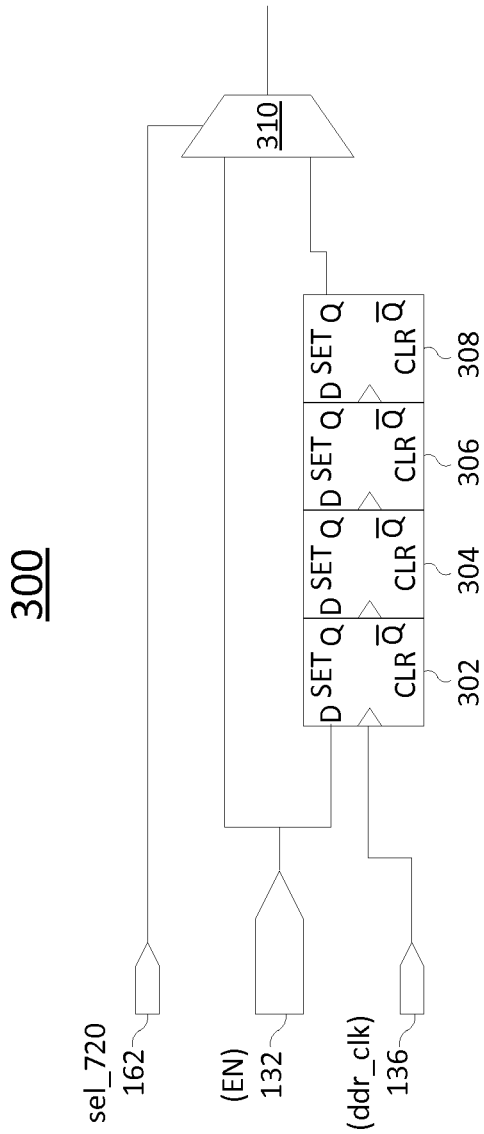
FIG. 2 illustrates another exemplary circuit to implementing a periodic delay.
Figure 3:
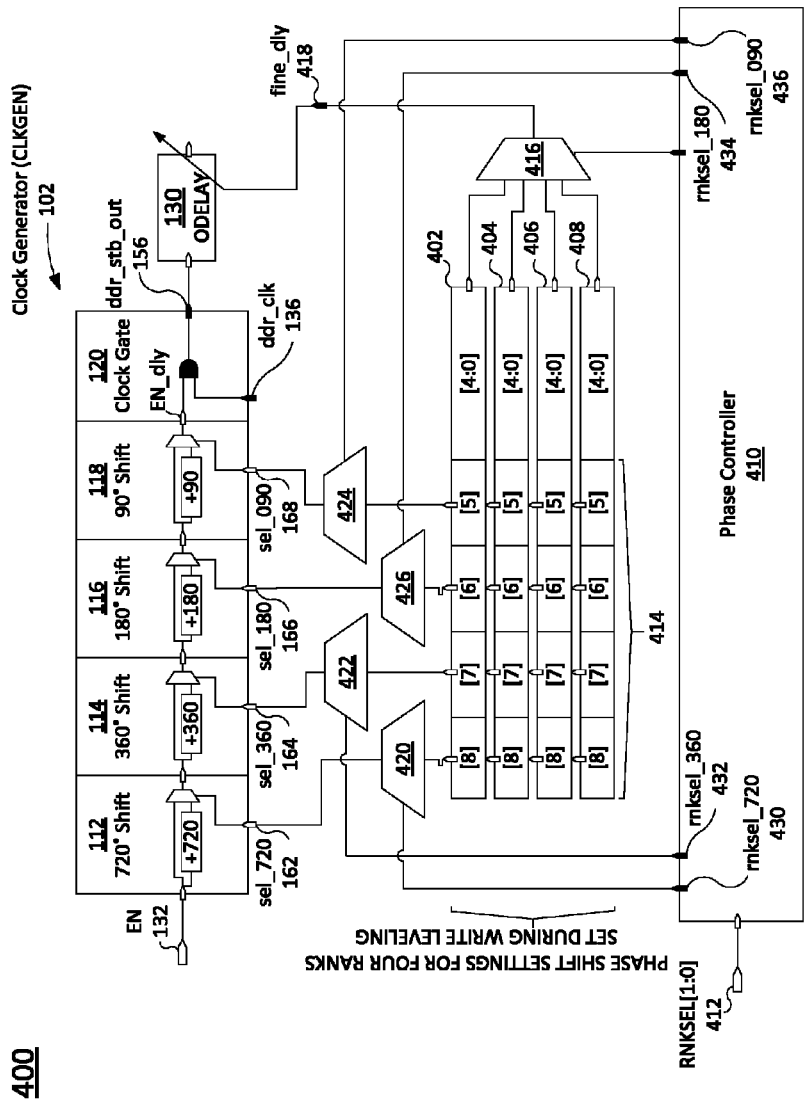
FIG. 3 illustrates an exemplary circuit with a plurality of registers.

FIG. 2 illustrates another example of an exemplary circuit 300 that can be used to implement one of the phase shifts 112, 114, 116, and 118. FIG. 3 illustrates an exemplary implementation of a 720 degree phase shift 112. In one embodiment, for a 720 degree phase shift, the enable signal 132 would be fed through a series of four flip flops 302, 304, 306, and 308. The clock signal 136, labeled "ddr_clk," may also be fed to the series of flip flops 302, 304, 306, and 308. In one embodiment, if the phase shift selection signal 162 is received indicating activation of the 720 degree phase shift, a multiplexor 310 may pass through the enable signal 132 that has passed through the series of flip flops 302, 304, 306, and 308. If the phase shift is not activated, the enable signal 132 may simply pass through the multiplexor 310 unaltered or without being phase shifted. Accordingly, for different amounts of phase shifts, more or less flips flops may be added or removed to achieve an appropriate amount of phase shift.

FIG. 3 illustrates one example of a circuit 400 that can be used to implement the methods described above with a configuration having a plurality of ranks of memory or multiple dual in-line memory modules (DIMMs). In one embodiment, the clock generator circuit 102 may be the same as the clock generator circuit in FIG. 1. For example, the clock generator 102 may include a plurality of phase shifts 112, 114, 116, and 118 and a clock gate 120. The clock gate 120 may gate on and off a clock signal 136 to generate a strobe clock signal 156. The strobe clock signal 156 may be phase shifted by any combination of one or more of the phase shifts 112, 114, 116, and 118 when enabled via the enable signal 132 and one or more phase shift selection signals 162, 164, 166, and 168.

Figure 4:
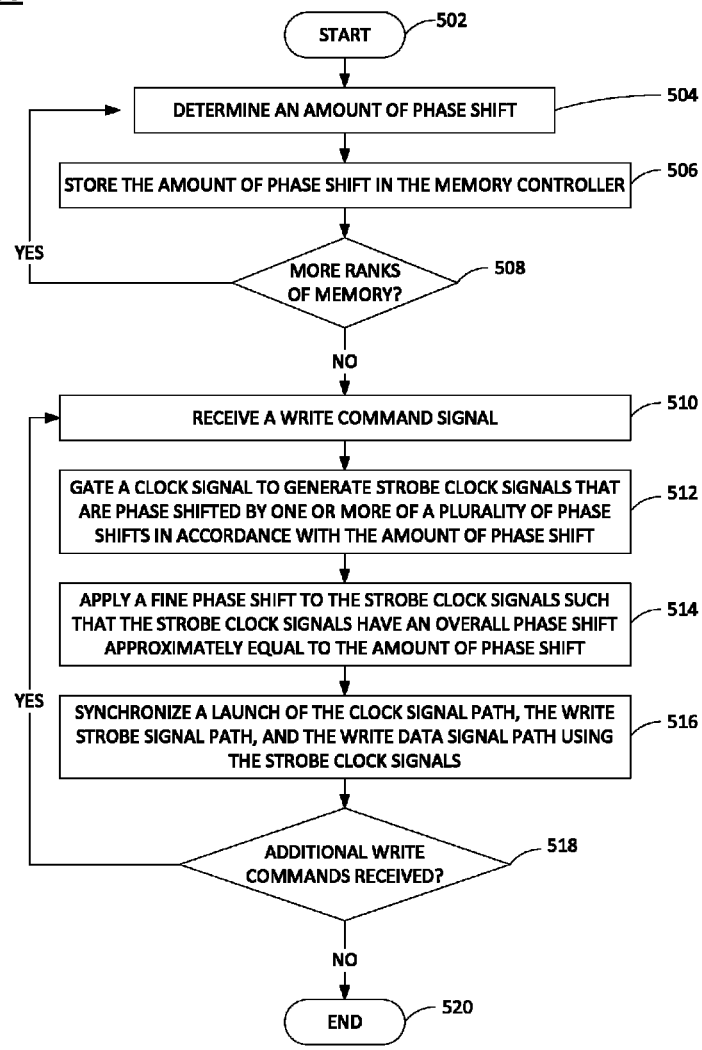
FIG. 4 illustrates an exemplary flow chart of a method for synchronizing a clock signal data path, a write strobe signal data path, and a write data signal data path that control a memory.

In one embodiment, the circuit 400 may also include stored phase shift settings 402, 404, 406, and 408 for each rank of memory (not shown) that can be switched in or out prior to a memory controller's access to a respective rank. Although four stored phase shift settings for four ranks of memory are illustrated in FIG. 3, it should be noted that any number of ranks may be deployed and configured in accordance with the embodiments illustrated in FIG. 3 and described below. In one embodiment, each of the stored phase shift settings 402, 404, 406, and 408 for each rank of memory may dedicate one or more bits 414 (e.g., within a register) to store an amount of phase shift and an amount of fine phase shift. For example, FIG. 4 illustrates the use of four bits, wherein each bit stores a 0 or 1 to indicate whether the corresponding phase shift should be turned on or off for a particular rank of memory. In one embodiment, another four bits may be used to store an amount of fine phase shift that should be applied by the fine phase shift 130 via a multiplexor 416 outputting a phase shift selection signal 418, fine_dly.

In one embodiment, a plurality of multiplexors 420, 422, 424, and 426 may be coupled to the registers storing bits 414 for each one of the stored phase shift settings 402, 404, 406, and 408. Respective rank select signals 430, 432, 434, and 436 (e.g., rnksel_720, rnksel_360, rnksel_180, and rnksel_090) may be coupled to the multiplexors 420, 422, 424, and 426. The rank select signals 430, 432, 434, and 436 for each one of the phase shifts 112, 114, 116, and 118 may instruct the multiplexors 420, 422, 424, and 426 to pass the bits 414 from a selected one of the stored phase shift settings 402, 404, 406, and 408 based on an incoming rank select signal 412 (e.g., RNKSEL). In one embodiment, a phase controller 410 may process the incoming rank select signal 412 and send the appropriate rank select signals 430, 432, 434, and 436 to the respective multiplexors 420, 422, 424, and 426.

To illustrate by example, a rank of memory associated with stored phase shift setting 402 may require a 270 degree phase shift. As a result, bits 5 and 6 of the bits 414 may store a value of 1 and bits 8 and 7 of the bits 414 may store a value of 0. Thus, if the rank of memory associated with the stored phase shift setting 402 is selected by the incoming rank select signal 412, the phase controller 410 may send rank select signals 430, 432, 434, and 436 to instruct the multiplexors 420, 422, 424, and 426 to pass the data for the bits 414 of the rank of memory associated with the stored phase shift setting 402. As a result, the phase shift 112 would receive a 0 and be inactive, the phase shift 114 would receive a 0 and be inactive, the phase shift 116 would receive a 1 and be activated to apply a phase shift of 180 degrees and the phase shift 118 would receive a 1 and be activated to apply a phase shift of 90 degrees. As a result, a total phase shift of 270 degrees would be applied to the strobe clock signal 156 for the rank of memory associated with the stored phase shift setting 402 as needed.

In one embodiment, the amount of phase shift required for each rank of memory associated with the stored phase shift settings 402, 404, 406, and 408 may be determined and stored during a write-level procedure. As discussed above, the embodiments of the present disclosure only require a single write-level procedure to be performed for each rank of memory, which is then stored in the stored phase shift settings 402, 404, 406, and 408 in the memory controller.

In one embodiment, the design of the clock generator 102 allows for fast switching between the ranks of memory via the stored phase shift settings 402, 404, 406, and 408. For example, as soon as the enable signal passes through a phase shift 112, 114, 116, or 118, the phase shift or phase shifts 112, 114, 116, or 118 can be ready for the next enable signal 132 for another rank of memory via the stored phase shift settings 402, 404, 406, or 408. In other words, the clock generator may be used to apply a phase shift to consecutive strobe signals 156 for different ranks of memory in a pipeline fashion one after another. Said another way, the loading of phase shift for a rank access need not wait for a previous rank access to completely finish processing through the entire clock generator 102 before applying the appropriate phase shift or phase shifts 112, 114, 116, or 118.

In one embodiment, the phase controller 410 may control the settings for the phase shifts 112, 114, 116, and 118 and the fine phase shift 130 for each consecutive rank of memory. For example, the phase controller 410 may control the timing and resetting of the phase shifts 112, 114, 116, and 118 and the fine phase shift 130 as the enable signal 132 for each rank of memory that passes through the clock generator 102.

Figure 5:
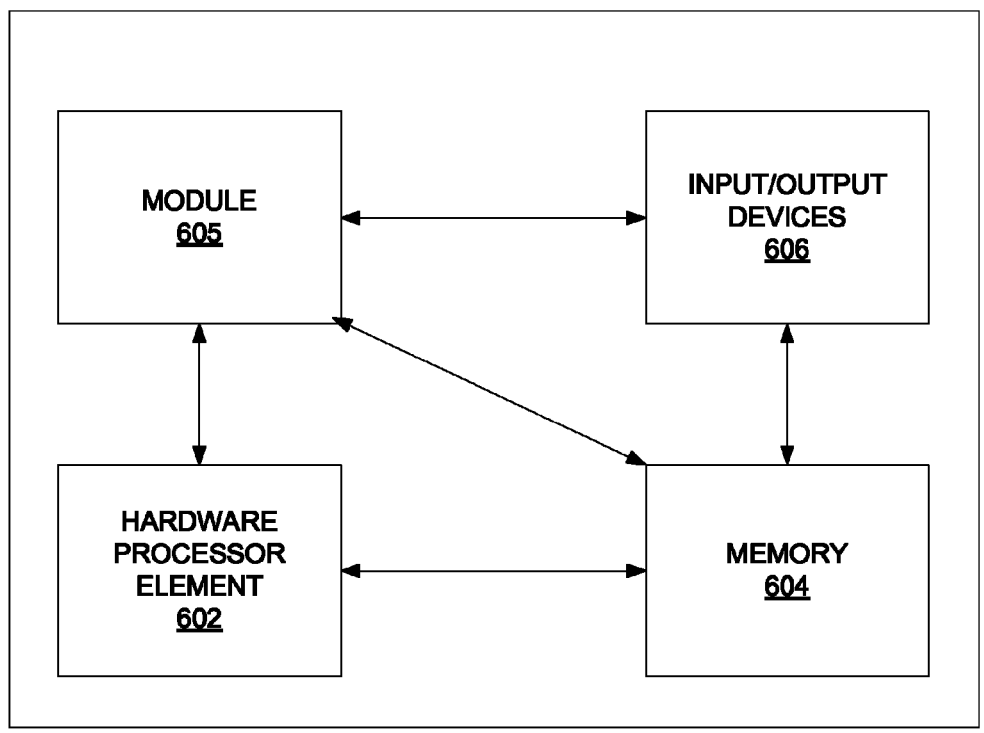
FIG. 5 illustrates a high-level block diagram of a general-purpose computer suitable for use in performing the functions described herein.

FIG. 4 illustrates a flowchart of a method 500 for synchronizing a clock signal data path, a write strobe signal data path, and a write data signal data path that control a memory. In one embodiment, the method 500 may be performed by a circuit or circuits as illustrated in FIGS. 1-3 or by a circuit or circuits of a memory controller of a memory (e.g., a DDR3 or DDR4 SDRAM) or (or any other hardware equivalent device) as illustrated in FIG. 5, and discussed below. In one embodiment, the various circuits as illustrated in FIGS. 1-3 can be implemented by a memory controller.

The method 500 begins at step 502. At step 504, the method 500 determines an amount of phase shift. For example, the amount of phase shift may be between the clock signal data path and the write strobe signal data path and between the clock signal data path and the write data signal data path. In one embodiment, the amount of phase shift may be determined or calculated by a write-leveling procedure that is performed during a start up of a computer system containing the memory.

At step 506, the method stores the amount of phase shift in the memory controller. In one embodiment, if multiple ranks of memory are used, then the memory controller may have stored phase shift settings for each rank of memory. The amount of phase shift is stored in bits associated with the rank of memory that was examined in step 502.

For example, a plurality of different ranks of memory may be configured in the computer system. The plurality of different ranks of memory may be configured in a fly-by clock architecture that results in each rank of memory having a different amount of phase shift or delay. The write-leveling procedure may determine the amount of phase shift for each rank of memory and store the amount of phase shift in one or more bits of a plurality of registers. In one embodiment, 8 bits may be used to store the amount of phase shift and a required fine phase shift, but the present disclosure is not limited to the number of bits that is used to store these settings.

At step 508, the method 500 determines if more ranks of memory are present that require a measurement of the amount of phase shift. If there are additional ranks of memory, the method 500 may return to step 504 to determine an amount of phase shift for the next rank of memory and repeat step 506 to store the amount of phase shift in the memory controller. However, if there are no additional ranks of memory, the method 500 proceeds to step 510.

At step 510, the method 500 receives a write command signal. For example, an enable signal 132 or 134 in FIG. 1, may be received to initiate the gating process to synchronize a launch of the write data signal (DQ) path, the write strobe signal (DQS) path, and the clock signal (CK) path. In one embodiment, if multiple ranks of memory are being used, the write command signal may include information identifying which rank of memory is being accessed.

At step 512, the method 500 gates a clock signal to generate strobe clock signals that are phase shifted by one or more of a plurality of phase shifts in accordance with the amount of phase shift. For example a common ddr_clk signal may be split into two separate clock generators that generate the strobe clock signals. For example, one strobe clock signal may be fed to the write data signal path and the write strobe signal path and the other strobe clock signal may be fed to the clock signal path.

In one embodiment, the plurality of phase shifts may be a function of a period of a clock signal of the memory. For example, one period of the clock signal may be equivalent to a 360 degree phase shift. In one embodiment, the phase shifts may be in 90 degree increments or one quarter of the period of the clock signal. In one embodiment, the plurality of phase shifts may consist of a 90 degree phase shift, a 180 degree phase shift, a 360 degree phase shift, and a 720 degree phase shift. One or more of the phase shifts may be selected to provide any amount of phase shift in 90 degree increments between 90 degrees to 720 degrees (e.g., 90 degrees, 180, degrees, 270 degrees, 360 degrees, 450 degrees, 540 degrees, and the like).

In one embodiment, the phase shifts may equate to an actual amount of time based on the data speed of the memory. For example, using a SDRAM memory having a data speed of 2.667 GHz/s, a clock period of 360 degrees may be equal to 750 picoseconds ps. A clock period of 90 degrees may be equal to 187.5 ps. The numerical values provided above are only examples and it should be noted that the actual amount of time associated with each period or phase shift will be a function of the data speed of the memory that applies method 500.

In one embodiment, the amount of phase shift that is to be applied may be stored as bits in registers of the memory controller. In other words, each rank of memory may have a stored phase shift setting. The rank of memory that is selected is contained in the write command signal received at step 510 and indicates which stored phase shift setting to apply.

At step 514, the method 500 applies a fine phase shift to the strobe clock signal such that the strobe clock signal has an overall phase shift approximately equal to the amount of phase shift. In one embodiment, the overall phase shift comprises the one or more plurality of phase shifts applied by the gating and the fine phase shift.

In one embodiment, the fine phase shift may be an amount of phase shift between 0 degrees and 90 degrees. The fine phase shift may be implemented using any known technique or circuit. It should be noted that the term "fine" does not denote a particular amount of phase shift and is simply used to denote an additional amount of phase shift that can be applied. In other words, the term "fine" does not provide a particular limitation and should be broadly interpreted as a label such as "first," "second," and so on.

In one embodiment, the amount of fine phase shift that is to be applied may also be stored as bits in registers of the memory controller. In other words, each rank of memory may have a stored phase shift setting that also includes an amount of fine phase shift that is needed. The rank of memory that is selected is contained in the write command signal received at step 510 and indicates which stored phase shift setting, including the needed amount of fine phase shift, to apply.

At step 516, the method 500 synchronizes a launch of the clock signal data path, the write strobe signal data path, and the write data signal data path to the strobe clock signals with the overall phase shift. For example, the phase of the strobe clock may be slightly off from the phase of the clock signal data path, the write strobe signal data path, and the write data signal data path. As result, each respective data path may include one or more phase shifts that can be applied to the respective data path to align the phase of the respective data path to the phase of the strobe clock having the overall phase shift.

At step 518, the method 500 determines if additional write commands are received. If another write command is received, the method 500 may return to step 510 and repeat steps 510, 512, 514, and 516. It should be noted that embodiments of the present disclosure enable "fast" rank switching. That is, the next strobe clock signal may be generated immediately after the enable signal has passed through a phase shift. In other words, the memory controller does not need to wait for the strobe clock signal to be completely generated or the enable signal to pass completely through the clock generator to begin processing of the next enable signal and generation of the next strobe clock signal.

If another write command is not received, the method may proceed to step 520. The method 500 ends at step 520.

It should be noted that although not explicitly specified, one or more steps, blocks, or functions of the method 500 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks, or functions in FIG. 4 that recite a determining operation, or involve a decision, do not necessarily require that both branches of the determining operation be practiced. In other words, one of the branches of the determining operation can be deemed as an optional step.

FIG. 5 depicts a high-level block diagram of a general-purpose computer or controller (e.g., a memory controller) suitable for use in performing the functions described herein. As depicted in FIG. 5, the system 600 comprises a hardware processor element (e.g., a CPU) 602, a memory 604, e.g., random access memory (RAM) and/or read only memory (ROM), a module 605 for synchronizing a clock signal data path, a write strobe signal data path, and a write data signal data path that control a memory and various input/output (I/O) devices 606, e.g., any type of storage device, an output port, an input port and any number of interfaces.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or functions of the above disclosed method. In one embodiment, the present module or process 605 for synchronizing a clock signal data path, a write strobe signal data path, and a write data signal data path that control a memory can be loaded into memory 604 and executed by the hardware processor element 602 to implement the functions as discussed above. As such, the present process 605 for synchronizing a clock signal data path, a write strobe signal data path, and a write data signal data path that control a memory as discussed above in method 500 (including associated data structures) of the present disclosure can be stored on a non-transitory (e.g., tangible or physical) computer readable storage medium, e.g., RAM memory, magnetic or optical drive or diskette and the like.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A method for synchronizing a clock signal data path, a write strobe signal data path, and a write data signal data path, comprising:

determining, by a memory controller, an amount of phase shift between the clock signal data path and the write strobe signal data path and between the clock signal data path and the write data signal data path;

gating, by the memory controller, a clock signal to generate strobe clock signals that are phase shifted by one or more of a plurality of phase shifts in accordance with the amount of phase shift;

applying, by the memory controller, a fine phase shift to the strobe clock signals where the strobe clock signals have an overall phase shift that is approximately equal to the amount of phase shift, where the overall phase shift comprises the one or more plurality of phase shifts applied by the gating and the fine phase shift; and synchronizing, by the memory controller, a launch of the clock signal data path, the write strobe signal data path, and the write data signal data path using the strobe clock signals with the overall phase shift.

2. The method of claim 1, wherein the plurality of phase shifts comprises a 90 degree phase shift, a 180 degree phase shift, a 360 degree phase shift, and a 720 degree phase shift and wherein the fine phase shift comprises a phase shift between 0 degrees and 90 degrees.

3. The method of claim 1, wherein the one or more of the plurality of phase shifts are applied to the clock signal in a clock generator.

4. The method of claim 1, wherein the gating is performed by turning on and off a clock gate on the clock signal that is a continuous clock signal.

5. The method of claim 1, wherein the synchronizing comprises:

adjusting, by the memory controller, a phase shift of the clock signal data path to align with one of the strobe clock signals with the overall delay, and adjusting a phase shift of the write strobe signal data path and the write data signal data path to align with another one of the strobe clock signals with the overall delay.

6. The method of claim 5, wherein the adjusting is performed by a respective shift deployed in the clock signal data path, the write strobe signal data path, and the write data signal data path.

7. The method of claim 1, wherein the one or more of a plurality of phase shifts and the fine phase shift are selected in accordance with a stored phase shift setting.

8. The method of claim 7, wherein the stored phase shift setting is associated with a rank of a memory having a plurality of ranks.

9. The method of claim 8, wherein a different stored phase shift setting may be selected for one of the plurality of phase shifts for a different one of the plurality of ranks after an enable signal passes through one of the plurality of phase shifts and before completion of applying a previous phase shift for a previous one of the plurality of ranks.

10. The method of claim 8, wherein the plurality of phase shifts are applied to consecutive strobe clock signals for different ranks of the plurality of ranks in a pipeline fashion using the clock signal.

11. A non-transitory computer-readable medium storing a plurality of instructions which, when executed by a memory controller, cause the memory controller to perform operations for synchronizing a clock signal data path, a write strobe signal data path, and a write data signal data path, the operations comprising:

determining an amount of phase shift between the clock signal data path and the write strobe signal data path and between the clock signal data path and the write data signal data path;

gating a clock signal to generate strobe clock signals that are phase shifted by one or more of a plurality of phase shifts in accordance with the amount of phase shift;

applying a fine phase shift to the strobe clock signals where the strobe clock signals have an overall phase shift that is approximately equal to the amount of phase shift, where the overall phase shift comprises the one or more plurality of phase shifts applied by the gating and the fine phase shift; and synchronizing a launch of the clock signal data path, the write strobe signal data path, and the write data signal data path using the strobe clock signals with the overall phase shift.

12. The non-transitory computer-readable medium of claim 11, wherein the one or more of the plurality of phase shifts are applied to the clock signal in a clock generator.

13. The non-transitory computer-readable medium of claim 11, wherein the gating is performed by turning on and off a clock gate on the clock signal that is a continuous clock signal.

14. The non-transitory computer-readable medium of claim 11, wherein the synchronizing comprises:

adjusting a phase shift of the clock signal data path to align with one of the strobe clock signals with the overall delay, and adjusting a phase shift of the write strobe signal data path and the write data signal data path to align with another one of the strobe clock signals with the overall delay.

15. The non-transitory computer-readable medium of claim 14, wherein the adjusting is performed by a respective shift deployed in the clock signal data path, the write strobe signal data path, and the write data signal data path.

16. The non-transitory computer-readable medium of claim 11, wherein the one or more of a plurality of phase shifts and the fine phase shift are selected in accordance with a stored phase shift setting.

17. The non-transitory computer-readable medium of claim 16, wherein a different stored phase shift setting may be selected for one of the plurality of phase shifts for a different one of the plurality of ranks after an enable signal passes through one of the plurality of phase shifts and before completion of applying a previous phase shift for a previous one of the plurality of ranks.

18. The non-transitory computer-readable medium of claim 16, wherein the plurality of phase shifts are applied to consecutive strobe clock signals for different ranks of the plurality of ranks in a pipeline fashion using the clock signal.

19. An apparatus for synchronizing a clock signal data path, a write strobe signal data path and a write data signal data path, comprising:

at least one clock gate for generating strobe clock signals;

a plurality of phase shifts coupled to the at least one clock gate, each one of the plurality of phase shifts having a different phase shift for applying a phase shift of an overall phase shift to the strobe clock signals;

at least one fine phase shift coupled to the at least one clock gate for applying an additional phase shift of the overall phase shift;

a clock signal data path coupled to the at least one fine phase shift;

a write strobe signal data path coupled to the at least one fine phase shift; and a write signal data path coupled to the at least one fine phase shift, wherein a launch of the clock signal data path, the write strobe signal data path and the write data signal data path is synchronized using the strobe clock signals with the overall phase shift.

20. The apparatus of claim 19, wherein the clock signal data path, the write strobe signal data path and the write signal data path each comprises a respective plurality of phase shifts.

\* \* \* \* \*